United States Patent [19]
Itoh et al.

[11] Patent Number: 5,231,589
[45] Date of Patent: Jul. 27, 1993

[54] INPUT/OUTPUT PIN ASSIGNMENT METHOD

[75] Inventors: Tutomu Itoh, Kanagawa; Tatsuki Ishii, Tokyo, both of Japan

[73] Assignee: Hitachi, Ltd., Tokyo, Japan

[21] Appl. No.: 624,565

[22] Filed: Dec. 10, 1990

[30] Foreign Application Priority Data

Dec. 11, 1989 [JP] Japan ................... 1-318775

[51] Int. Cl.⁵ ............................................ G06F 15/60
[52] U.S. Cl. ............................ 364/490; 364/489; 364/488
[58] Field of Search ............... 364/488, 489, 490, 491

[56] References Cited

U.S. PATENT DOCUMENTS

| | | | |
|---|---|---|---|
| 3,603,771 | 9/1971 | Iselt et al. | 364/491 |
| 4,683,384 | 7/1987 | Shibata et al. | 364/491 |
| 5,038,294 | 8/1991 | Arakawa et al. | 364/491 |
| 5,065,355 | 11/1991 | Hayase | 364/491 |

*Primary Examiner*—Vincent N. Trans
*Attorney, Agent, or Firm*—Antonelli, Terry, Stout & Kraus

[57] ABSTRACT

For signal lines to be connected from an LSI device or a module including a plurality of LSI devices as a mounted part via input/output pins thereof to external devices, pin assignment positions are determined as follows. The signal lines are classified into groups depending on attributes thereof. Priority levels are determined for the resultant groups according to the attributes. Based on relationships with respect to arrangement positions of the mounted parts to be connected to the signal lines, provisional pin positions are computed so as to minimize wiring lengths between the mounted parts. The input/output pins are assigned to the provisional pin positions for each signal line group in an order of the priority levels.

16 Claims, 10 Drawing Sheets

| ITEM NO. | CASE | | PROVISIONAL PIN POSITION | GRAPHIC IMAGE |
|---|---|---|---|---|
| 1 | OUTPUT SIGNAL [S] | ENTIRELY VERTICAL OR HORIZONTAL ARRANGEMENT ~85 | CENTRAL POSITION ON SIDE LINE OF NEXT LSI DEVICE | S K₁ K₂ ~76 / 89 90 |
| 2 | | VERTICAL OR HORIZONTAL ARRANGEMENT UP TO INTERMEDIATE POINT ~86 | END POINT ON K₂ SIDE OF SIDE LINE ON NEXT LSI DEVICE | S K₁ K₂ / 89 901 |
| 3 | | OTHERS ~87 | END POINT HAVING SMALLEST DISTANCE TO NEXT LSI DEVICE | S 902 K₁ K₂ |
| 4 | INPUT SIGNAL [Kᵢ] ~88 | | DECIDED PIN POSITION ON OUTPUT SIDE AND POSITION HAVING SMALLEST DISTANCE THERETO | S K₁ K₂ |

[S] : LSI DEVICE FOR WHICH OUTPUT PINS ARE ASSIGNED IN CONSIDERATION OF A SIGNAL LINE

[Kᵢ] : LSI DEVICE FOR WHICH i-TH INPUT PIN TO BE CONNECTED TO OUTPUT PIN IS ASSIGNED

○ PROVISIONAL PIN POSITION

● DECIDED PIN POSITION

INPUT/OUTPUT PIN ASSIGNMENT METHOD

BACKGROUND OF THE INVENTION

The present invention relates to a method of automatically assigning input/output pins of large scale integration (LSI) devices and modules in electronic apparatuses designed in a hierarchic fashion.

Conventionally, there has been known a pin assignment method as described in JP-A-59-197189 wherein in order to attain a satisfactory wiring efficiency, when assigning pins of signal lines to be connected from a lower-priority part to an external device by use of pins, those pins existing along connecting directions of the signal lines are selected for the pin assignment, thereby reducing the total length of signal lines.

In the prior art referred to above, however, consideration has not been given to attributes of signal lines to be assigned with the input/output pins, which leads to a problem of an occurrence of a signal delay defect or failure. Delay defects are considerably related to three cases as follows. In the first case, although bus lines corresponding to the respective bits of a register are desirably required to have a uniform delay time, because the respective pins are allocated to dispersed positions, the delay time has a large fluctuation. In the second case, when signal lines of a plurality of external gates connected to an identical internal gate of an LSI device are to be connected via output pins, the pins for the signal lines are required to be assigned to positions in the vicinity of an output gate so as to prevent the delay time in the LSI device from being remarkably increased. In the third case, the wiring order is required to be determined in consideration of delay time of a path including the signal lines to which pins are to be assigned. If the wiring order is arbitrarily determined, the pin assignment is delayed for signal lines included in a path having a smaller margin between the allowable delay time and the computed delay time such that some pins are assigned to be disadvantageously elongate wiring lengths between LSI devices and/or modules. In the description above, a path designates a closed wiring between flip-flop circuits.

SUMMARY OF THE INVENTION

It is therefore an object of the present invention to provide an input/output pin assignment method capable of suppressing the possible causes of the delay effects, namely, the fluctuation of delay time, the increase in delay time, and the elongation of wiring lengths.

In order to achieve the object above, there is provided an input/output pin assignment method in which signal lines to be assigned with pins are classified into groups depending on attributes thereof. Each of the groups is assigned with a priority level based on delay time for the group. A group of pins are assigned to each of the groups in an order of the priority levels.

Namely, in the pins assignment method according to the present invention, attributes of respective signal lines to be assigned with pins are analyzed to classify all signal lines into groups. Each group is assigned with a priority level and then provisional pin positions are computed to minimize wiring lengths between mounting parts such as LSI devices and modules so as to accomplish a pin assignment for each group.

The signal lines to which pins are to be related are classified into groups of signals lines, each group being connected to bus lines to be assigned with pins at a time or to an identical internal gate, thereby forming groups of respective signal lines. For each name based on a naming rule of signal lines, the bus lines are grouped. Thereafter, the logic circuits are traced to detect signal lines to be connected to an identical inner gate so as to create groups of the signal lines for each internal gate.

For each signal line group thus decided, a priority level is determined as follows. In this priority determination method, for each signal line belonging to the group, a delay margin time of a path thereof is computed to attain the smallest value thereof, which is set as a delay margin time of the pertinent signal line group. The priority levels are assigned to the signal line groups in an ascending order of the delay margin time. In the signal line groups, the pin assignment is conducted in the order of priority levels. In an alternative method of determining priority levels of line groups, for each signal line of each signal line group, a virtual wiring length between mounting parts is computed based on the assumption that a pin position of a mounting part to be connected to the signal line is set to a center position of the mounting part. Of the attained lengths, the maximum value is defined as a virtual wiring length of the signal line group. Or, for each signal line group, a mean value is computed for virtual wiring lengths of signal lines belonging to the group to define the mean value as a virtual wiring length of the group. The priority levels are assigned to the groups in a decending order of the virtual wiring lengths of the respective groups.

The provisional pin position is determined to be a position of a pin of a signal line for which a wiring length between mounting parts such as LSI devices and modules is minimized. In this situation, provisional pin positions may be duplicated for the respective signal lines. In a case of such a duplication of provisional pin positions, a readjustment is conducted for the positions in a pin assignment which will be described later. Based on the provisional pin positions thus decided for the respective signal lines belonging to the group, a provisional pin position is computed for the group.

In a pin assignment for each group, pins of signal lines associated with the group are assigned to a periphery of the provisional pin position of the group. The pin assignment is conducted in conformity with a restriction that signal lines which vary respective states thereof at an identical timing shall not be arranged to be adjacent to each other. According to the present invention, the pin decision is carried out such that only one pin is assigned to a position, namely, the duplication of pins at a position is inhibited.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENT

A description will now be given of an embodiment in accordance with the present invention.

The present invention relates to assignment of input-/output pins of LSI devices or modules when designing an electronic apparatus or device having a hierarchic structure in which a plurality of LSI devices are placed on a module so that a plurality of such modules are mounted on a board. In this regard, a pin assignment of LSI devices will be described in association with an embodiment according to the present invention. A method of the present invention is also applicable to a case where input/output pins are assigned for modules or the like associated with other hierarchic levels.

Figure 1:
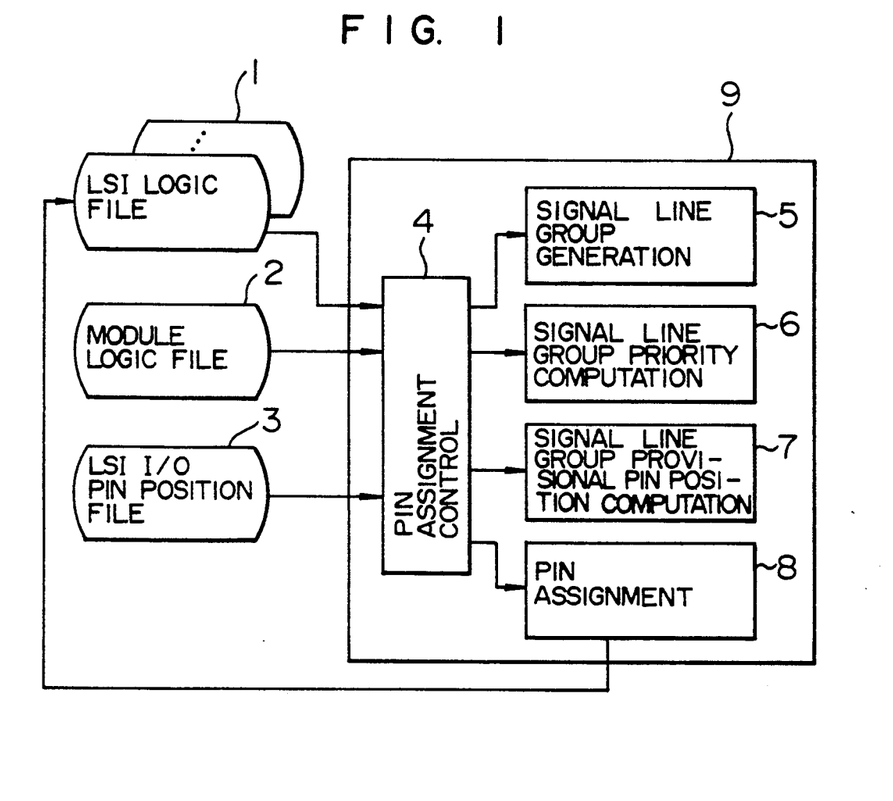
FIG. 1 is an explanatory diagram useful to explain an input/output pin assignment method according to the present invention.

FIG. 1 shows a procedure of a method of assigning input/output pins of LSI devices. A reference numeral 1 denotes an LSI logic file storing therein connective relationships for gates, flip-flop circuits, and input/output pins of an LSI device. Namely, as many LSI logic files are disposed as there are LSI devices. A reference numeral 2 designates a module logic file loaded with connective relationships between LSI devices placed on the module, a reference numeral 3 indicates an LSI input/output pin position file containing position coordinates of input/output pins disposed on LSI devices, a reference numeral 9 shows an overall configuration of pin assignment processing programs and is stored in a main storage (not shown) of a computer (not shown), a reference numeral 4 denotes a pin assignment control program supervising the overall input/output pin assignment processing, a reference numeral 5 designates a signal line group generation program for creating groups of signal lines (to be called external connection signal lines herebelow) to be assigned with input/output pins, a reference numeral 6 indicates a signal line group priority computation program for assigning priority levels to the signal line groups, a reference numeral 7 indicates a signal line group provisional pin position computation program for computing provisional pin positions, and a reference numeral indicates a pin assignment program for assigning the pins to the external connection signal lines. Referring now to FIGS. 2 to 12, a description will be given of a procedure of the input-/output pin assignment method.

Figure 2:
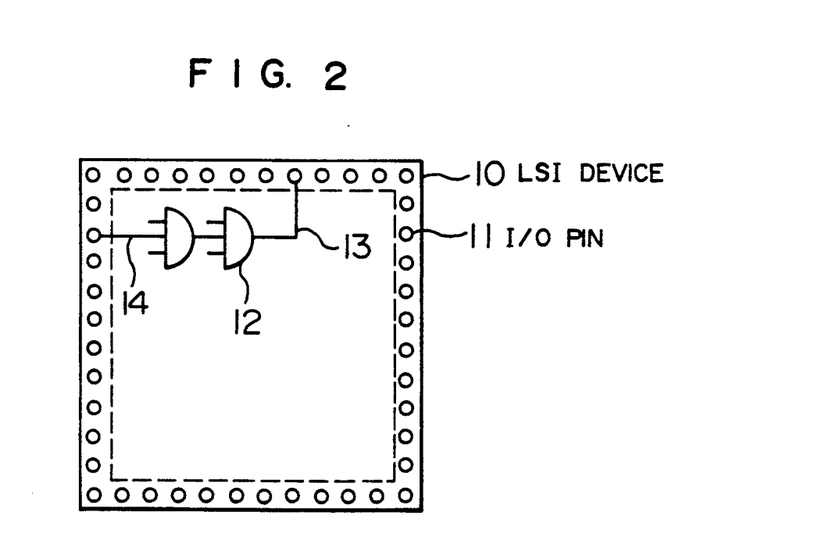
FIG. 2 is a schematic diagram showing an LSI device mounting state.

FIG. 2 shows an example of arrangement and assignment of input/output pins of an LSI device 10 including input/output pins 11, a gate circuit 12, and external connection signal lines 13 and 14 already assigned with input/output pins. More specifically, the reference numerals 13 and 14 respectively denote output and input signal lines, which are assigned with output and input pins, respectively. A pin assignment means an operation to generate correspondence relationships between signal lines and pins beforehand disposed as shown in FIG. 2.

Figure 3:
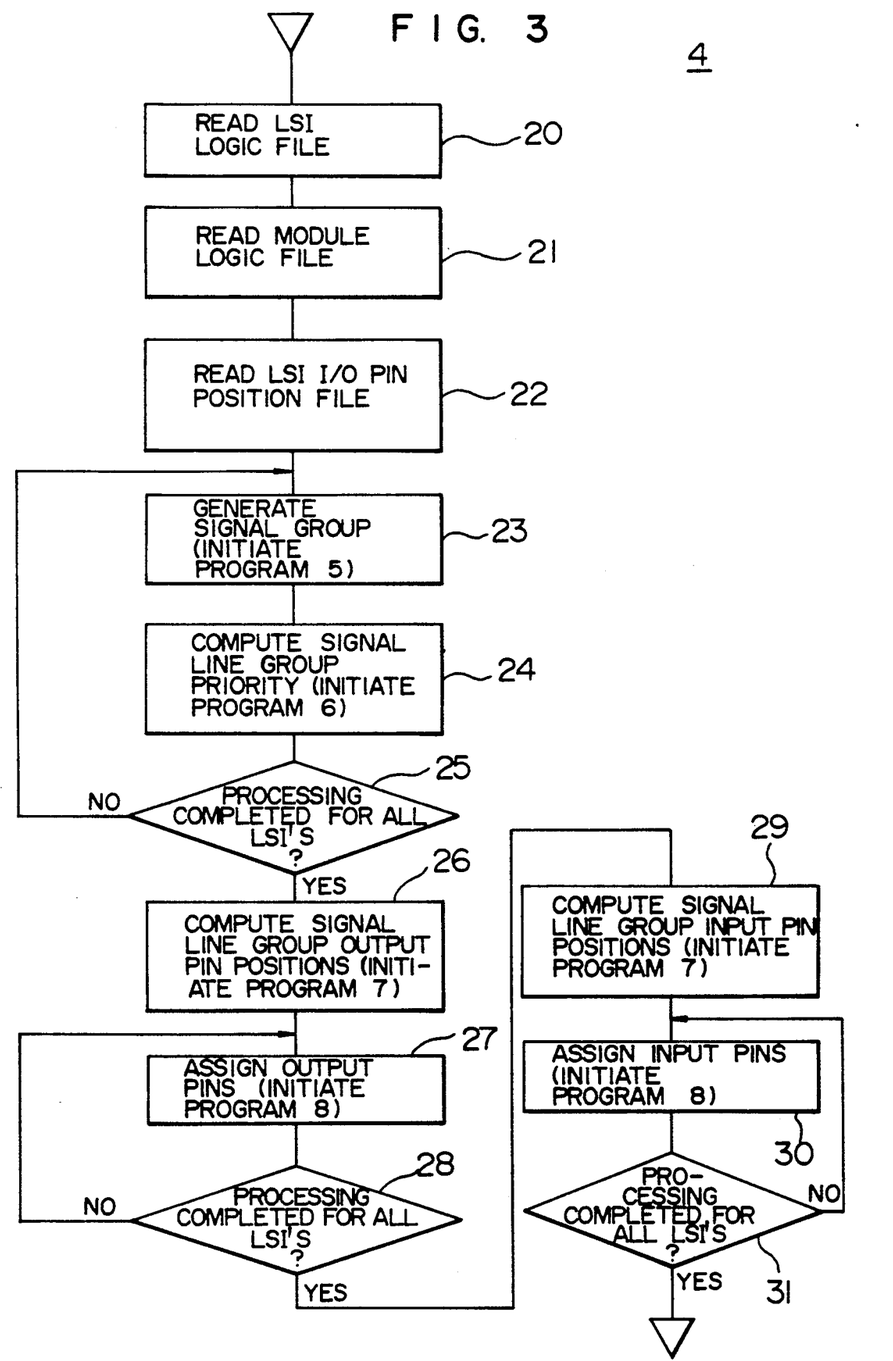
FIG. 3 is a flowchart showing the operation of a pin assignment control.

FIG. 3 shows a processing flowchart of the pin assignment control program 4. Processing steps will now be described in the processing sequence. In a step 20, the system reads contents of the LSI logic files 1 respectively related to all LSI devices mounted on a module. A step 21 reads contents of the module logic file 2. A step 22 then accesses the LSI input/output pin position file 3 to get contents thereof. Steps 23 and 24 are repeatedly executed for all LSI devices on the module. In the steps 23 and 24, the system initiates the signal line group generation program 5 and the signal line group priority computation program 6, respectively. A step 25 achieves a loop control for the steps 23 and 24. Processing of steps 26 to 28 is executed to assign output pins to external connection signal lines on the output side of the LSI devices mounted on the module. In processing steps 29 to 31, input pins are assigned to external connection signal lines on the input side of the LSI devices. In this two-stage control of the pin assignment, for example, when conducting a wiring between LSI devices aligned in a horizontal or vertical direction, output pins are assigned in a first stage, and then for an input pin assignment in a second stage, input pin positions are selected to minimize distances between the output and input pins, thereby advantageously reducing the wiring lengths between the LSI devices. The steps 26 and 29 each initiate the signal line group provisional pin position computation program 7. In each of the steps 27 and 30, the pin assignment program 8 is started to accomplish a pin assignment. The steps 28 and 31 respectively conduct a loop control of the steps 27 and 30 for all LSI devices on the module, thereby completing the operation of the pin assignment control program 4.

Figure 4:
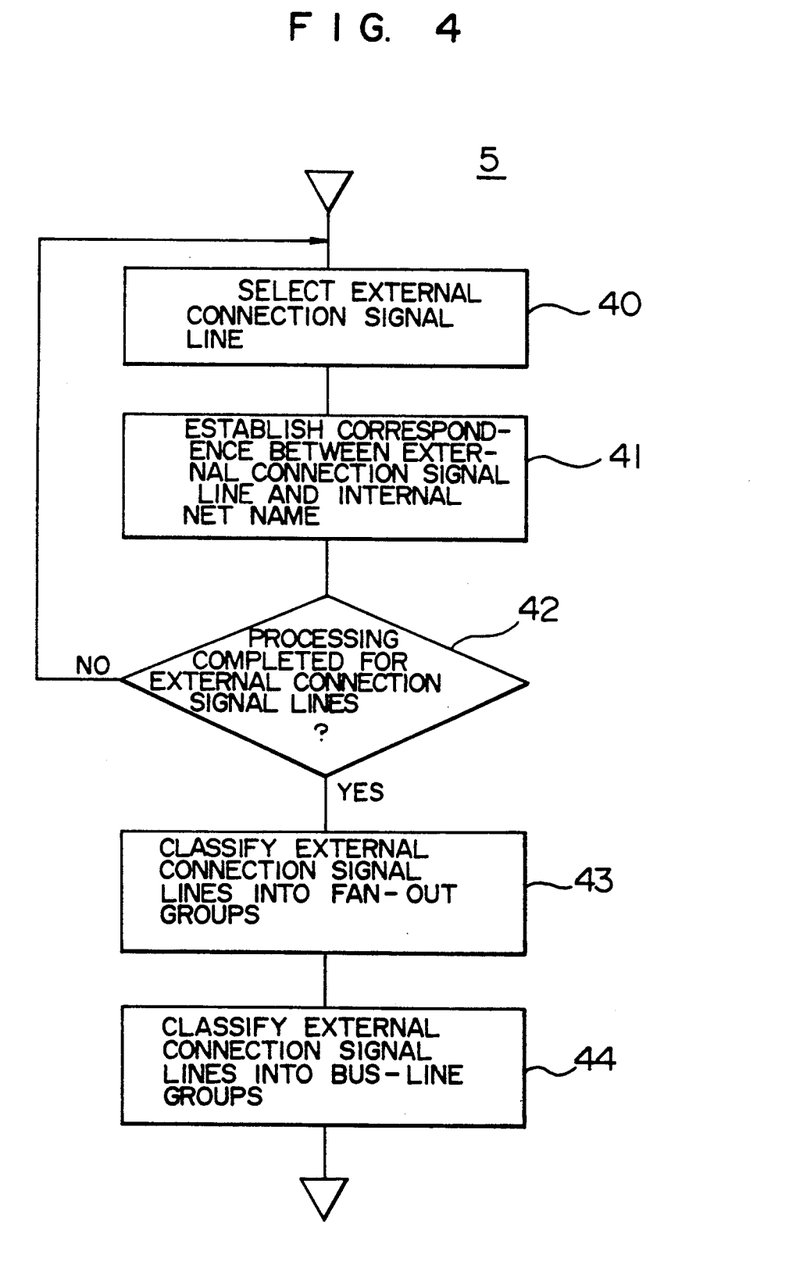
FIG. 4 is a flowchart showing the operation of a signal line group creation.
Figure 6:
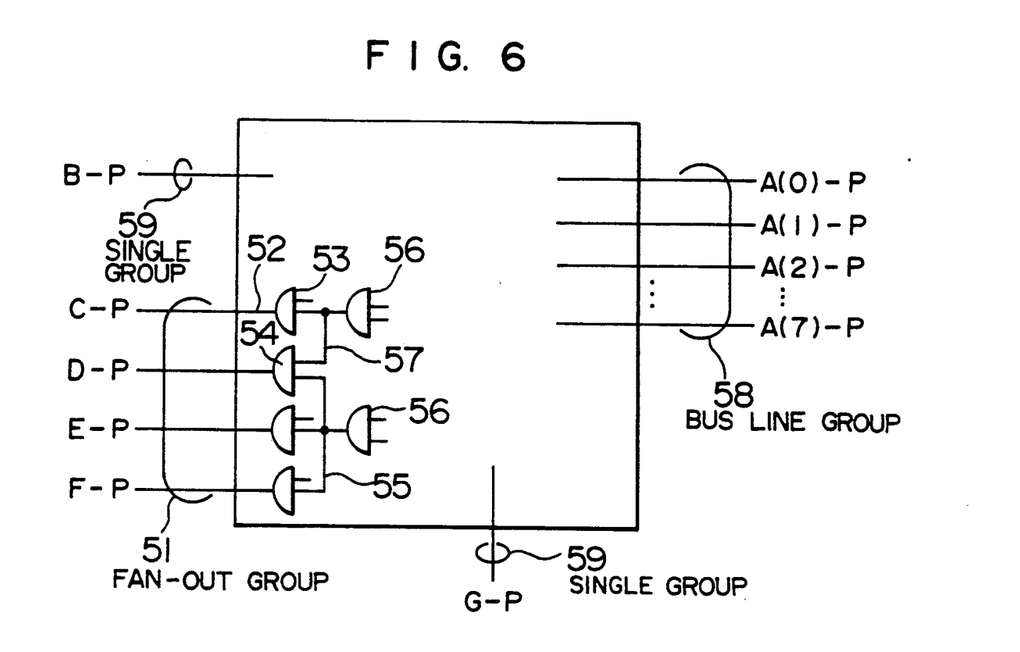
FIG. 6 is a schematic diagram showing signal line groups.

Subsequently, referring to FIGS. 4 and 6, a description will be given of the operation of the signal line group generation program 5. FIG. 4 shows a processing flow of the signal line group generation program 5, whereas FIG. 6 is an example of grouping of signal lines. The processing flowchart will now be described by reference to FIG. 6. Steps 40 to 43 of FIG. 4 constitute a processing flow of a fan-out group generation in which external connection signal lines on the output side are classified into groups for the respective internal gates. The step 40 selects one of the external connection signal lines on the output side. The selection order is not particularly restricted. The step 41 determines a name (internal net name) of an internal signal line as an input to an external gate to be connected to the signal line obtained in the step 40. In this connection, the configuration of FIG. 6 includes external connection signal lines 52 on the output side, external gates 53 and 54 for an external interface to be directly connected to external connection signal lines, internal signal lines 55 and 57 as inputs to the external gates, and internal gates 56. The step 41 of FIG. 4 establishes correspondence relationships between the external connection signal lines 52 and the signal names, i.e. internal net names, of the internal signal lines 55 and 57 of FIG. 6. The step 42 of FIG. 4 achieves a loop control for iteration of the processing steps 40 and 41 with respect to all external connection signal lines on the output side of the LSI device. The step 43 classifies the external connection signal lines into groups for each identical internal net name attained in the step 41, thereby generating fan-out groups. Incidentally, when a plurality of internal net names are related to an identical external connection signal line, the internal net names are assumed to be associated with the same fan-out group. Namely, in the configuration of FIG. 6, two internal lines 55 and 57 are inputted to the external gate 54 and hence are considered to belong to an identical fan-out group 51. A group including only one external connection signal line is not assumed to belong to a fan-out group. A step 44 of FIG. 4 executes processing to create groups of bus lines. For the bus lines, based on the naming rules thereof, the signal names of all external connection signal lines in the LSI device are analyzed to produce a group of bus lines for each signal name. In accordance with the naming rules of bus lines, lines having an identical arrangement or having identical leading characters in signal names thereof are treated as bus lines. Namely, in the diagram of FIG. 6, a group of bus lines 58 is constituted with lines having the same arrangement name A. In the grouping operation above, if the external connection signal lines belongs to a fan-out group and to a group of bus lines, the signal lines are assumed be related to the fan-out group. When an external connection signal line belongs to neither one of these groups, the line is treated as a single group 59. The fan-out groups, groups of bus lines, and single groups are collectively called signal line groups, respectively.

Figure 5:
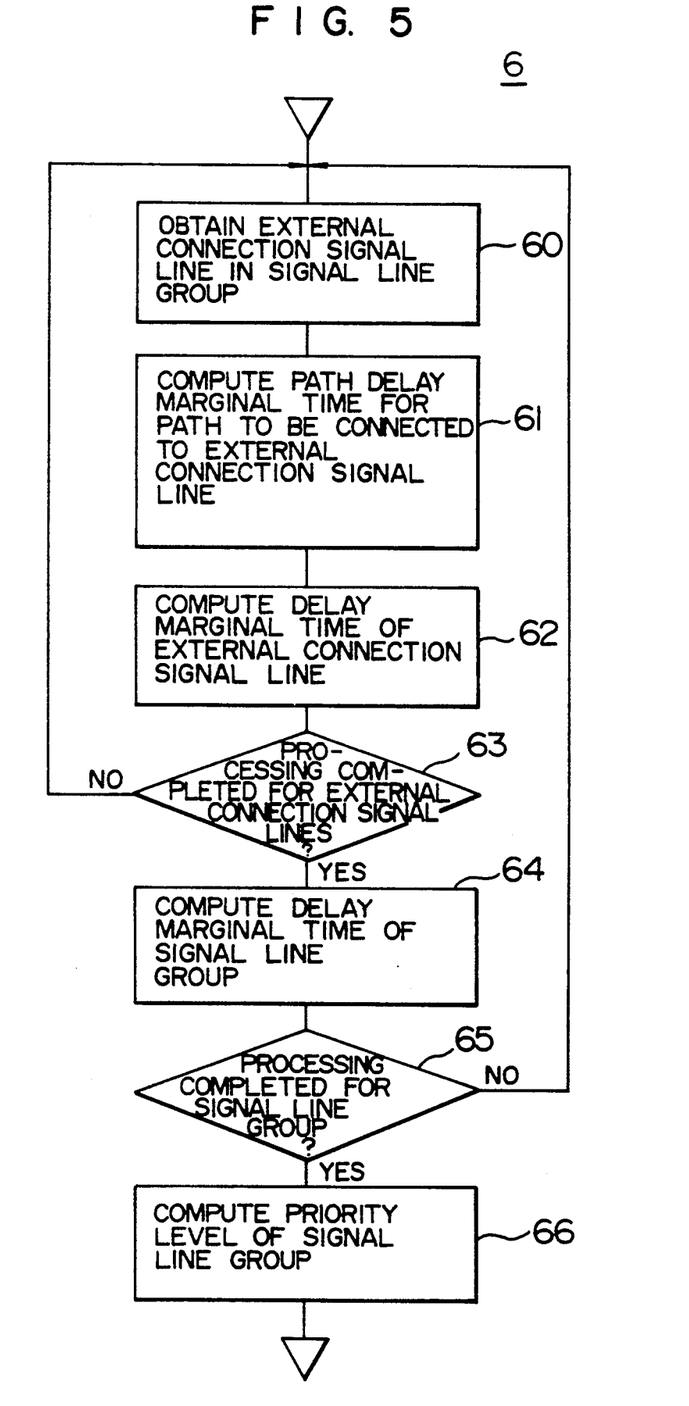
FIG. 5 is a flowchart showing the operation for computing signal line group priority levels.
Figure 7:
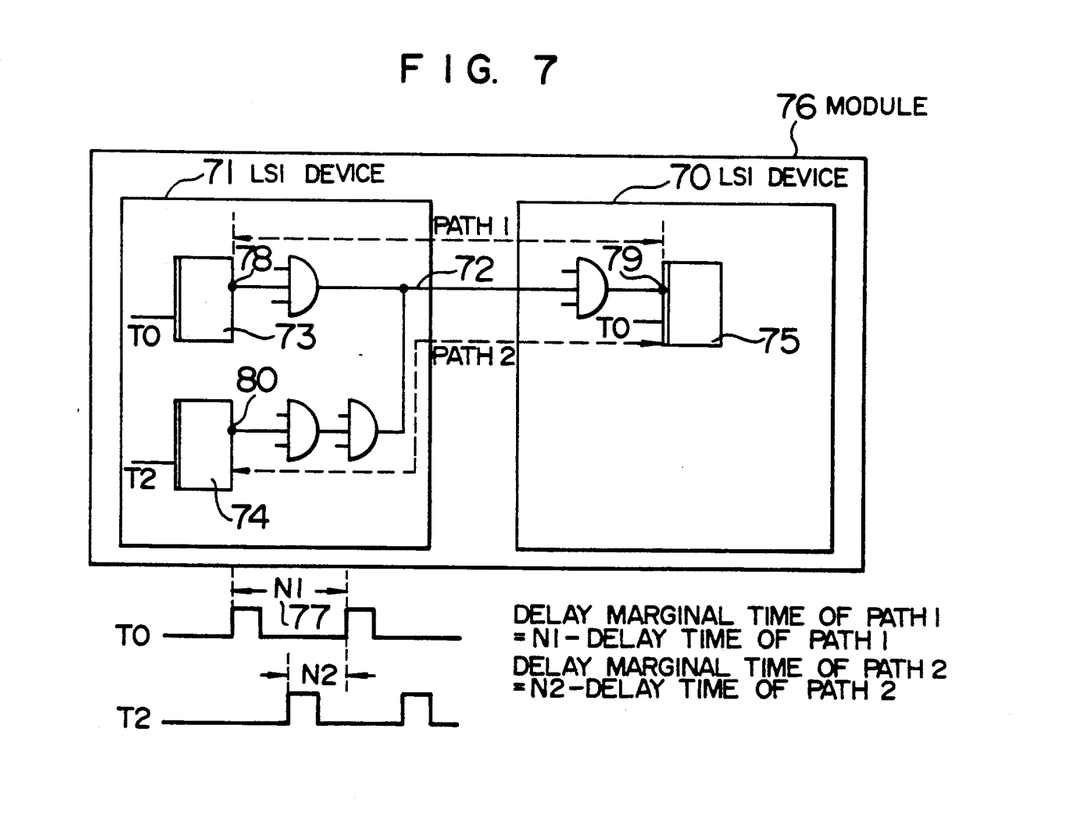
FIG. 7 is a diagram useful to explain a computation example of a path delay marginal time.

Referring next to FIGS. 5 and 7, a description will be given of the operation achieved by the signal line group priority computation program 6 of FIG. 1. FIG. 5 shows a processing flow of the signal line group priority computation program 6, whereas FIG. 7 shows a computation example of a path delay marginal time. The processing flow of FIG. 5 will be described by referring to FIG. 7. A step 60 of FIG. 5 selects a line from the external connection signal lines in a signal line group. The order of selecting the line is not especially restricted. A step 61 computes a path delay marginal time for each of the paths (wirings between flip-flops) to be connected to the selected external connection signal line. The path delay marginal time is calculated as (difference between clock time values of flip-flops respectively disposed at both ends of a path)−(path delay time). In this computation, the (difference between clock time values of flip-flops respectively disposed at both ends of a path) is a maximum allowable signal transfer time of the pertinent path. Unless otherwise specified for the path by the user, the (path delay time) is equal to or less than a cycle time. The (path delay time) denotes a signal transfer time to be elapsed for a signal transfer from an output pin of a flip-flop to an input pin of another flip-flop. As shown in FIG. 7, for LSI devices or elements 70 and 71 installed on a module 76, paths to be connected to an external connection signal line 72 of the LSI element 71 includes a path 1 between a pin 78 of a flip-flop 73 and a pin 79 of a flip-flop 75 and a path 2 between a pin 80 of a flip-flop 74 and the pin 79 of the flip-flop 75. The delay marginal time of the path 1 is here obtained by subtracting the path delay time of the path 1 from a difference N1 77 between clock time values respectively of the flip-flops 73 and 75. A step 62 of FIG. 5 determines a smallest value of the path delay marginal time of all paths connected to the external connection signal line to set the value as the delay marginal time of the external connection signal line. A step 63 controls iteration of the processing steps 60 to 62 for all external connection signal lines in the pertinent signal line group. A step 64 decides a smallest value of the delay marginal time associated with external connection signal lines belonging to the signal line group to set the value as the delay marginal time of the signal line group. A step 65 supervises repetition of the processing steps 60 to 64 for all signal line groups in the LSI device. A step 66 sorts the signal line groups in an ascending order of values of the delay marginal time of the respective groups. The priority levels of the pins assignment to the signal line groups are assigned in the order above, thereby completing the operation of the signal line group priority computation program 6.

Figure 8:
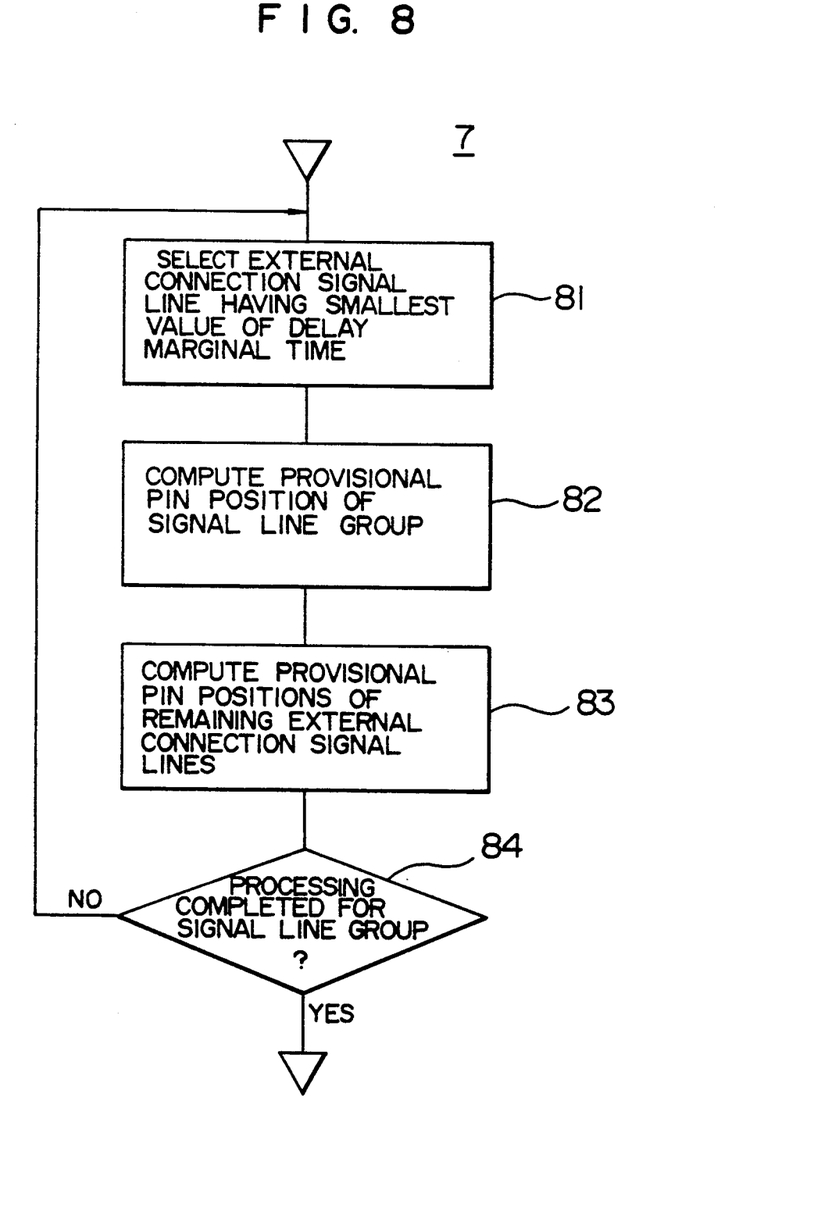
FIG. 8 is a flowchart showing the operation for computing a provisional pin position for a signal line group.
Figure 9:
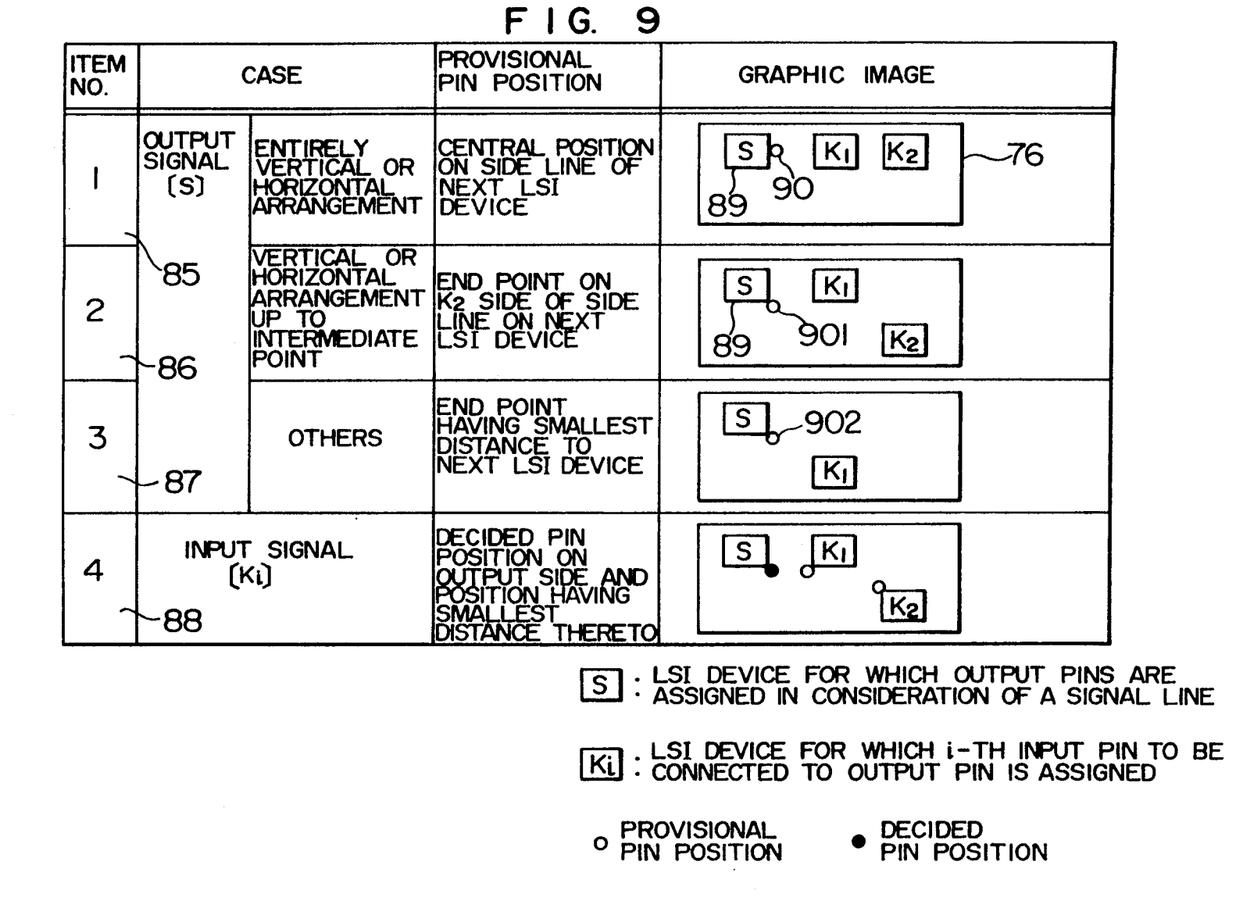
FIG. 9 is a schematic diagram for explaining a method of computing provisional pin positions for external connection signal lines.

Referring now to FIGS. 8 and 9, a description will be given of the operation of the signal line group provisional pin position computation program 7. FIG. 8 is a processing flowchart of the program 7, whereas FIG. 9 schematically show a method of computing provisional pin positions for external connection signal lines. A step 81 of FIG. 8 selects from a signal line group an external connection signal line having a smallest value of the delay marginal time. A step 82 then computes a provisional pin position of the external connection signal line for which the wiring length between LSI devices is minimized and then sets the computed position as a provisional pin position of the signal line group. A step 83 similarly computes provisional pin positions for the remaining signal lines belonging to the signal line group. A step 84 controls iteration of the processing steps 81 to 83 for all signal line groups. Referring now to FIG. 9, a description will be given of the method of computing provisional pin positions of external connection signal lines in four cases as follows. The computation of provisional pin positions are carried out in a sequence of LSI devices to which the signal lines are to be connected. Reference numerals 85 to 87 are related to cases where provisional pin positions of output signals are computed. A reference numeral 88 denotes a case where provisional pin positions of input signals are computed. A reference numeral 85 designates a case where all LSI devices on signal lines are arranged in a vertical or horizontal direction. In this situation, a provisional pin position of an LSI device 89 is set to a central position on a side line thereof as indicated by a small circle 90, the side line facing an LSI device ($K_1$) to which a signal line is to be next connected. The reference numeral 86 denotes a case where LSI devices are vertically or horizontally arranged up to an intermediate point and thereafter the LSI devices are horizontally or vertically arranged. As indicated by a small circle 901, a provisional pin position of the LSI device 89 is set to an end point on a side line facing an LSI device ($K_1$) to which a signal line is next to be connected, the end point having the smallest distance to an LSI device ($K_2$) where the direction of the LSI device arrangement is changed. The reference numeral 87 designates a case other than those above. As indicated by a small circle 902, a provisional pin position of the LSI device 89 is set to an end pint having the smallest distance to an LSI device ($K_1$) to which a signal line is next to be connected. In the case 88, provisional pin positions are computed for input signals. In this regard, assuming a position indicated by a solid circle to be a pin position beforehand determined for an LSI device associated with an output signal, a provisional position is set to a position marked with a circle having a smallest distance from the solid circle. Description has been given of the operation of the signal line group provisional pin position computation program of FIG. 1. Namely, for each signal line group, the program 7 selects from the external connection signal lines belonging thereto a line having the minimum value of delay marginal time, namely, having the most critical delay time. The provisional pin position of the signal line group is set to a pin position which minimizes a wiring length of an LSI device to which the selected signal line is connected. In this stage, a plurality of signal lines may be related to the provisional pin position.

Figure 10:
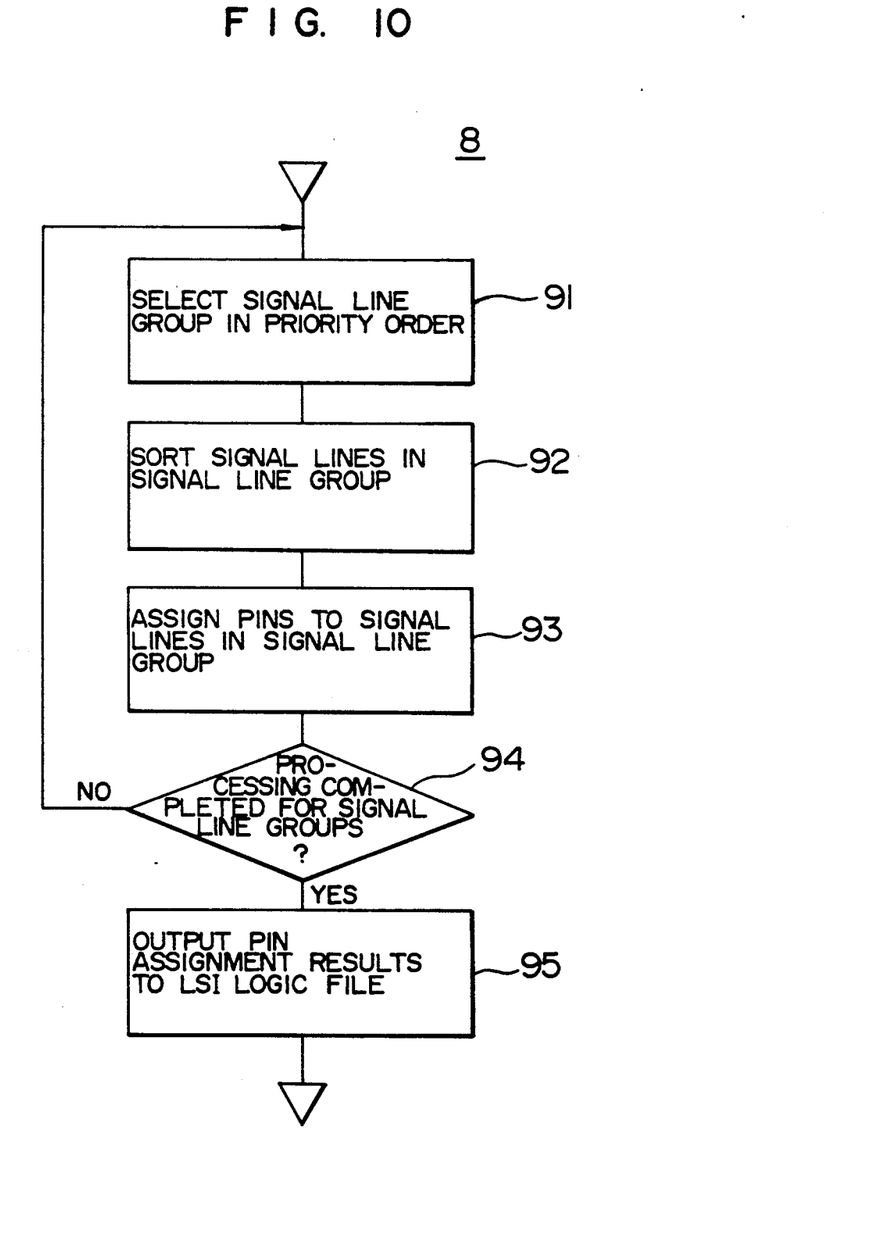
FIG. 10 is a flowchart showing the operation of a pin assignment.

Subsequently, referring to FIG. 10, a description will be given of the pin assignment program 8 of FIG. 1. A step 91 selects one of the signal line groups in the order of priority levels assigned thereto. A step 92 connects signal lines of the selected signal line group to provisional pin positions thereof computed in the provisional pin position computation program 7 and then rearranges the pins in a descending order of priority levels of the respective signal lines. When two or more signal line groups take an identical provisional pin position, the pin assignment is achieved in an order in which data items of signal lines are written in the LSI logic file 1. As a result of the processing of the step 92, the wirings between the arranged LSI devices have been rearranged. For the external connection signal lines of the pertinent signal line group, a step 93 searches for free pins which exist on the right and left sides of a pin near the provisional pin position of the group and which are consecutively assignable, thereby assigning the pins to the signal lines. In this operation, the pins are assigned in an ascending order of pin numbers to the external connection signal lines in an order of the arrangement thereof. The pin assignment is conducted in conformity with a rule that pins of signal lines changing states thereof at an identical timing shall not be set to positions located adjacent to each other. A step 94 controls iteration of the processing steps 91 to 93 for all signal line groups. A step 95 outputs a pin assignment result of each signal line to the LSI logic file 1, thereby completing the operation of the pin assignment program 8 of FIG. 1.

Figure 11:
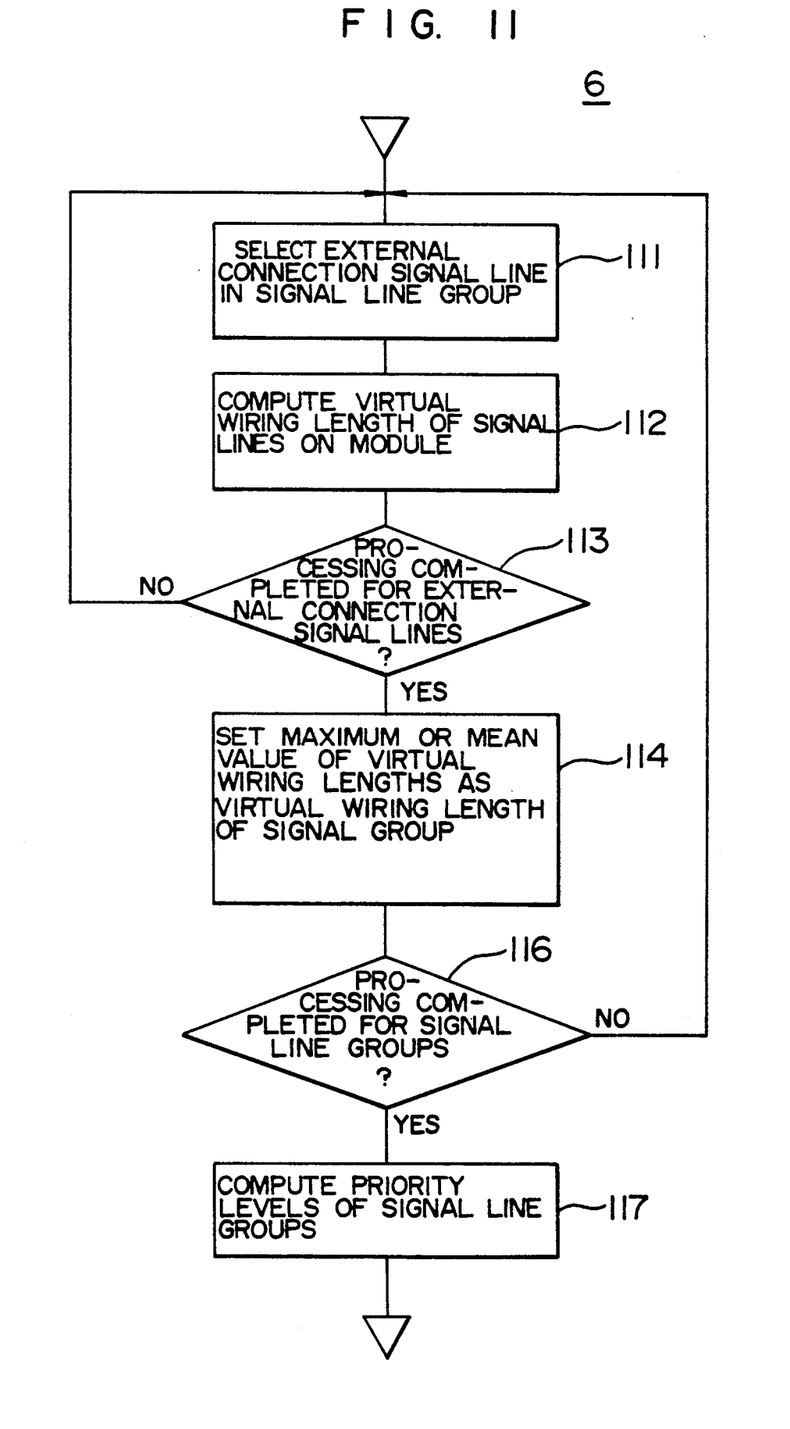
FIG. 11 is a flowchart showing the operation for computing signal line group priority levels, which is different from that of FIG. 5.
Figure 12:
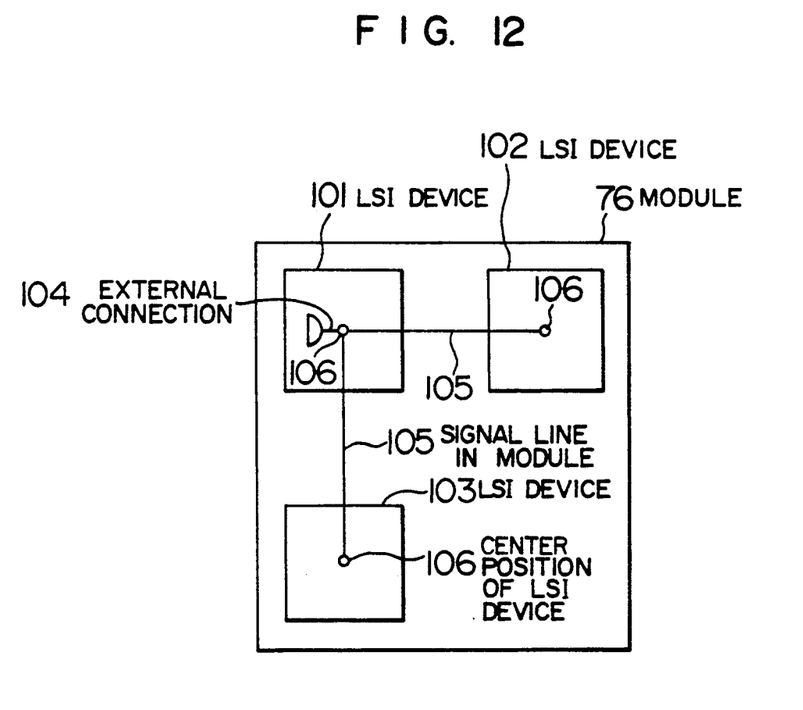
FIG. 12 is a diagram schematically showing a method of computing a virtual wiring length based on the assumption that a pin is set to a center position of an LSI device.

Next, referring to FIGS. 11 and 12, a description will be given of the signal line group priority computation in an alternative embodiment according to the present invention which is different from that described in conjunction with FIGS. 5 and 7. In this embodiment, the priority level of a signal line group is computed depending on virtual wiring lengths. FIG. 11 is a flowchart of processing executed by the signal line group priority computation program 6, whereas FIG. 12 shows an example of the computation of a virtual wiring length. A step 111 of FIG. 11 selects one of the external connection signal lines of the signal line group. The selection sequence is not particularly restricted. A step 112 computes, based on the assumption that all pin positions of signal lines in a module to which the selected external connection signal line is connected are located at a center position of the LSI device, virtual wiring lengths of the signal lines in the module. Referring now to FIG. 12, a description will be given of a method of computing a virtual wiring length. In this case, a module is loaded with LSI devices 101, 102, and 103, and signal lines 105 in the module 76 connected to an external connection signal line 104 are to be linked with pins of the three LSI devices. When computing virtual wiring lengths of the signal lines 105 in the module 76, since pin positions of the respective LSI devices are not determined, a center position 106 of each LSI device is assumed to be the pin position thereof for the wiring length computation. A step 113 of FIG. 11 controls repetition of the processing steps 111 and 112 for all external connection signal lines belonging to the pertinent signal line group. A step 114 determines for the external connection signal lines belonging to the signal line group a largest or mean value of the virtual wiring lengths to set the obtained value as a virtual wiring length of the signal line group. A step 116 supervises iteration of the processing steps 111 to 114 for all signal line groups. A step 117 sorts the signal line groups in a descending order of the virtual wiring lengths. This order is employed as an order of priority levels assigned to the respective signal line groups. Description has been given of the operation of the alternative embodiment of the signal line group priority computation program 6.

In accordance with the present invention, the bus lines have a uniform delay time, the delay time in an LSI device associated with output signal lines connected to an identical internal gate is reduced, and wiring lengths between LSI devices and between modules are minimized, thereby decreasing the delay time. Furthermore, according to the present invention, the higher priority level is assigned to a signal line having the shorter delay marginal time so as to assign pins to signal lines in the priority level sequence to minimize wiring lengths of the lines, thereby reducing a chance of a delay defect. As a result, the wiring efficiency is improved and the period of time necessary for designing an electronic device or apparatus can be reduced.

As many apparently widely different embodiments of the present invention can be made without departing from the spirit and scope thereof, it is to be understood that the invention is not limited to the specific embodiments thereof except as defined in the appended claims.

We claim:

1. An input/output pin assignment method for assigning a plurality of input/output pins of each circuit device of a plurality of circuit devices to be mounted on a common mounting device to a plurality of input/output signal lines of said each circuit device connecting said each circuit device to at least one other circuit device of the plurality of circuit devices, comprising the steps of:
   (a) classifying the plurality of input/output signal lines of said each circuit device into a plurality of signal line groups each including at least one input/output signal line of the plurality of input/output signal lines of said each circuit device;
   (b) selecting, for each signal line group of the plurality of signal line groups, a different input/output pin of the plurality of input/output pin for said each signal line group based on a positional relationship between said each circuit device and at least one other circuit device of the plurality of circuit devices to which said each circuit device is to be connected by said at least one input/output signal line of said each signal line group; and
   (c) assigning a different input/output pin of the plurality of input/output pins of said each circuit device to each input/output signal line of said at least one input/output signal line of said each signal line group based on the provisional input/output pin selected for said each signal line group.

2. A method according to claim 1, wherein each circuit device of the plurality of circuit devices includes gates, and wherein each signal line group of the plurality of signal line groups obtained in the step (a) is one of
- a group of input/output signal lines of the plurality of input/output signal lines of said each circuit device constituting a bus,
- a group of input/output signal lines of the plurality of input/output signal lines of said each circuit device which are all connected to one gate of said each circuit device, and
- a group of input/output signal lines of the plurality of input/output signal lines of said each circuit device which do not constitute a bus and which are not all connected to one gate of said each circuit device.

3. A method according to claim 1, wherein the plurality of input/output signal lines of said each circuit device include a plurality of input signal lines and a plurality of output signal lines;
wherein the plurality of signal line groups obtained in the step (a) include
input signal line groups each including at least one input signal line of the plurality of input signal lines, and
output signal line groups each including at least one output signal line of the plurality of output signal lines;
wherein the step (b) includes the steps of:
(b1) selecting, for each output signal line group of the plurality of signal line groups, a different input/output pin of the plurality of input/output pins of said each circuit device as a provisional input/output pin for said each output signal line group based on a positional relationship between said each circuit device and at least one other circuit device of the plurality of circuit devices to which said each circuit device is to be connected by said at least one output signal line of said each output signal line group; and
(b2) selecting, for each input signal line group of the plurality of signal line groups, a different input/output pin of the plurality of input/output pins of said each circuit device as a provisional input/output pin for said each input signal line group based on
a positional relationship between said each circuit device and at least one other circuit device of the plurality of circuit devices to which said each circuit device is to be connected by said at least one input signal line of said each input signal line group, and
a provisional input/output pin selected for an output signal line group including an output signal line of a circuit device of said at least one other circuit device which is to be connected to an input signal line of said at least one input signal line of said each input signal line group;
wherein the step (c) includes the steps of:
(c1) determining an order of selection of the plurality of signal line groups obtained in the step (a);
(c2) sequentially selecting each output signal line group of the plurality of signal line groups based on the order of selection determined in the step (c1);
(c3) assigning, as each output signal line group of the plurality of signal line groups is sequentially selected, a different input/output pin of the plurality of input/output pins of said each circuit device to each output signal line of said each output signal line group, said different input/output pin not having been previously assigned to an input/output signal line of the plurality of input/output signal lines of said each circuit device and being selected from a group of adjacent input/output pins of the plurality of input/output pins of said each circuit device including the provisional input/output pin selected for said each output signal line group;
(c4) sequentially selecting each input signal line group of the plurality of signal line groups based on the order of selection determined in the step (c1); and
(c5) assigning, as each input signal line group of the plurality of signal line groups is sequentially selected, a different input/output pin of the plurality of input/output pins of said each circuit device to each input signal line of said each input signal line group, said different input/output pin not having been previously assigned to an input/output signal line of the plurality of input/output signal lines of said each circuit device and being selected from a group of adjacent input/output pins of the plurality of input/output pins of said each circuit device including the provisional input/output pin selected for said each input signal line group.

4. A method according to claim 1, wherein the step (a) includes the step of classifying the plurality of input/output signal lines of said each circuit device into a plurality of signal line groups each including at least one input/output signal line of the plurality of input/output signal lines of said each circuit device based on relationships between signals carried by the plurality of input/output signal lines of said each circuit device.

5. A method according to claim 1, wherein the plurality of signal line groups obtained in the step (a) include signal line groups each including a group of input/output signal lines of the plurality of input/output signal lines of said each circuit device to which it is desirable to assign a group of adjacent input/output pins of the plurality of input/output pins of said each circuit device.

6. A method according to claim 1, wherein the step (c) includes the step of assigning a different input/output pin of the plurality of input/output pins of said each circuit device to each input/output signal line of said at least one input/output signal line of said each signal line group, said different input/output pin being located as near as possible to the provisional input output pin selected for said each signal line group.

7. A method according to claim 1, wherein the step (c) includes the steps of:
(c1) determining an order of selection of the plurality of signal line groups obtained in the step (a);
(c2) sequentially selecting each signal line group of the plurality of signal line groups based on the order of selection determined in the step (c1); and
(c3) assigning, as each output signal line group of the plurality of signal line groups is sequentially selected, a different input/output pin of the plurality of input/output pins of said each circuit device to each output signal line of said at least one input/output signal line of said each signal line group, said different input/output pin not having been previously assigned to an input/output signal line of the plurality of input/output signal lines of said each circuit device and being selected from a group of adjacent input/output pins of the plurality of input/output pins of said each circuit device including the provisional input/output pin selected for said each signal line group.

8. A method according to claim 7, wherein the step (c1) includes the steps of:
- (c11) determining respective priority levels of the plurality of signal line groups obtained in the step (a); and
- (c12) determining an order of selection of the plurality of signal line groups based on the respective priority levels of the plurality of signal line groups.

9. A method according to claim 8, wherein each circuit device of the plurality of circuit devices includes flip-flops, and wherein the step (c11) includes the steps of:
- (c111) computing, for each input/output signal line of each signal line group of the plurality of signal line groups, a delay marginal time of a path between a flip-flop in said each circuit device connected to said each input/output signal line and a flip-flop in another circuit device of the plurality of circuit devices which is to be connected to said each input/output signal line;
- (c112) selecting, for each signal line group of the plurality of signal line groups, a smallest delay marginal time of all delay marginal times computed for input/output signal lines of said each signal line group as a delay marginal time of said each signal line group; and
- (c113) determining respective priority levels of the plurality of signal line groups based on the respective delay marginal times of the plurality of signal line groups such that the priority levels increase as the delay marginal times decrease.

10. A method according to claim 8, wherein the step (c11) includes the steps of:
- (c111) computing, for each input/output signal line of each signal line group of the plurality of signal line groups, a virtual wiring length between said each circuit device and another circuit device for the plurality of circuit devices which is to be connected to said each input/output signal line;
- (c112) selecting, for each signal line group of the plurality of signal line groups, a largest virtual wiring length of all virtual wiring lengths computed for input/output signal lines of said each signal line group as a virtual wiring length of said each signal line group; and
- (c113) determining respective priority levels of the plurality of signal line groups based on the respective virtual wiring lengths of the plurality of signal line groups such that the priority levels increase as the virtual wiring lengths increase.

11. A method according to claim 10, wherein the step (c111) includes the step of computing, for each input/output signal line of each signal line group of the plurality of signal line groups, a virtual wiring length between said each circuit device and another circuit device of the plurality of circuit devices which is to be connected to said each input/output signal lie based on an assumption that each input/output pin of the plurality of input/output pins of said each circuit device is located at a center position of said each circuit device and each input/output pin of the plurality of input/output pin of said another circuit device is located at a center position of said another circuit device.

12. An input/output pin assignment method for assigning a plurality of input/output pins of each circuit device of a plurality of circuit devices to be mounted on a common mounting device to a plurality of input/output signal lines of said each circuit device connecting said each circuit device to at least one other circuit device of the plurality of circuit devices, comprising the steps of:
- (a) classifying the plurality of input/output signal lines of said each circuit device into a plurality of signal line groups each including at least one input/output signal line of the plurality of input/output signal lines of said each circuit device based on relationships between signals carried by the plurality of input/output signal lines of said each circuit device;
- (b) determining a priority level of each signal line group of the plurality of signal line groups based on signals carried by said at least one input/output signal line of said each signal line group;
- (c) sequentially selecting each signal line group of the plurality of signal line groups in an order depending on the priority level of said each signal line group; and
- (d) assigning, as each signal line group of the plurality of signal line groups is sequentially selected, a different input/output pin of the plurality of input/output pins of said each circuit device to each input/output signal line of said at least group, said different input/output pin not having been previously assigned to an input/output signal line of the plurality of input/output signal lines of said each circuit device.

13. An input/output pin assignment method for assigning a plurality of input/output pins of each circuit device of a plurality of circuit devices to be mounted on a common mounting device to a plurality of output signal lines of said each circuit device carrying signals to be transmitted from said each circuit device to at least one other circuit device of the plurality of circuit devices and to a plurality of input signal lines of said each circuit device carrying signal to be received by said each circuit device from at least one other circuit device of the plurality of circuit devices, comprises the steps of:
- (a) sequentially selecting each circuit device of the plurality of circuit devices;
- (b) assigning, as each circuit device of the plurality of circuit devices in sequentially selected, a different input/output pin of the plurality of input/output pins of said each circuit device to each output signal line of the plurality of output signal lines of said each circuit device; and
- (c) after input/output pins have been assigned to all of the plurality of output signal lines of all of the plurality of circuit devices, assigning a different input/output pin of the plurality of input/output pins of each circuit device of the plurality of circuit devices to each input signal line of the plurality of input signal lines of said each circuit device based on a location of an input/output pin of another circuit device of the plurality of circuit devices assigned to an output signal line of said another circuit device carrying a signal to be received by said each input signal line, said different input/output line of the plurality of output signal lines of said each circuit device.

14. A method according to claim 13, wherein the step (b) includes the steps of:
- (b1) selecting one input/output pin of the plurality of input/output pins of said each circuit device; and
- (b2) sequentially assigning a different input/output pin of the plurality of input/output pins of said each circuit device to each output signal line of the plurality of output signal lines of said each circuit device beginning with said selected one input/output pin and continuing with other input/output pins of the plurality of input/output pins of said each circuit device which are progressively further away from said selected one input/output pin.

15. A method according to claim 14, wherein the step (b1) includes the step of selecting one input/output pin of the plurality of input/output pins of said each circuit device based on a position of said each circuit device relative to other circuit devices of the plurality of circuit devices.

16. A method according to claim 15, wherein the step (b2) includes the steps of:

(b21) determining a priority level of each output signal line of the plurality of output signal lines of said each circuit device; and (b22) sequentially assigning a different input/output pin of the plurality of input/output pins of said each circuit device to each output signal line of the plurality of output signal lines of said each circuit device in an order depending on the priority level of said each output signal line beginning with said selected one input/output pin and continuing with other input/output pins of the plurality of input/output pins of said each circuit device which are progressively further away from said selected one input/output pin.

* * * * *